(12) United States Patent
Achanta et al.

(10) Patent No.: US 11,372,045 B2
(45) Date of Patent: Jun. 28, 2022

(54) PREDICTIVE MAINTENANCE OF PROTECTIVE DEVICES USING WIRELESS LINE SENSORS AND SYSTEMS

(71) Applicant: Schweitzer Engineering Laboratories, Inc., Pullman, WA (US)

(72) Inventors: Shankar V. Achanta, Pullman, WA (US); Kei Hao, Anaheim, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 324 days.

(21) Appl. No.: 16/752,173

(22) Filed: Jan. 24, 2020

(65) Prior Publication Data

US 2021/0231736 A1    Jul. 29, 2021

(51) Int. Cl.
| | | |
|---|---|---|
| *G01R 31/333* | (2006.01) | |
| *G01R 31/327* | (2006.01) | |
| *H02H 1/00* | (2006.01) | |
| *H02H 7/26* | (2006.01) | |

(52) U.S. Cl.
CPC ..... *G01R 31/3333* (2013.01); *G01R 31/3278* (2013.01); *H02H 1/0007* (2013.01); *H02H 7/26* (2013.01)

(58) Field of Classification Search
None
See application file for complete search history.

(56) References Cited

U.S. PATENT DOCUMENTS

| | | |
|---|---|---|
| 5,550,476 A | 8/1996 | Lau |
| 5,565,783 A | 10/1996 | Lau |
| 5,656,931 A | 8/1997 | Lau |
| 8,650,411 B2 | 2/2014 | Feight |
| 8,665,102 B2 | 3/2014 | Salewske |
| 10,161,986 B2 | 12/2018 | Schweitzer |
| 10,419,064 B2 | 9/2019 | Cosic |
| 2005/0068193 A1 | 3/2005 | Osterloh |
| 2006/0084419 A1 | 4/2006 | Rocamora |
| 2007/0093977 A1* | 4/2007 | Yuan ............ H02H 7/001 702/58 |
| 2008/0077336 A1 | 3/2008 | Fernandes |
| 2010/0013632 A1 | 1/2010 | Salewske et al. |
| 2013/0329331 A1* | 12/2013 | Erger ............ H01H 9/168 361/102 |
| 2014/0119331 A1 | 5/2014 | Ji |

* cited by examiner

*Primary Examiner* — Jas A Sanghera
(74) *Attorney, Agent, or Firm* — Bradley W. Schield; Richard M. Edge (57) ABSTRACT

Systems and methods to detect that a protective device is operating outside of a time inverse overcurrent tolerance region are described. For example, a central monitoring station may obtain a time inverse overcurrent tolerance region of a protective device on a power line. The central monitoring station may obtain a fault magnitude measurement and a fault duration measurement of a wireless line sensor on the power line. The central monitoring station may determine that the protective device is operating outside of the tolerance region based at least in part on the fault magnitude measurement and the fault duration measurement. The central monitoring station may provide a signal indicating that there is a potential issue with the protective device.

18 Claims, 7 Drawing Sheets

PREDICTIVE MAINTENANCE OF PROTECTIVE DEVICES USING WIRELESS LINE SENSORS AND SYSTEMS

TECHNICAL FIELD

The present disclosure relates generally to wireless line sensors and, more particularly, to using fault magnitudes and fault durations from wireless line sensors for detecting conditions of protective devices.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Protective devices, such as recloser controls, protective relays, intelligent electronic devices (IEDs), and the like, may be used to protect the power delivery system. For example, a protective device may receive current measurements of a power line. The protective device may detect faults on the power line using the current measurements. If a fault occurs on the power line, the protective device may open a circuit breaker to protect the power system.

One fault detection technique is referred to as time inverse overcurrent protection where the amount of current at which to trip varies inversely with respect to how much time has occurred. For example, over a relatively short period of time, the protective device may trip at relatively higher currents and over a relatively longer period of time, the protective device may trip at relatively lower currents, as compared to the higher currents.

The protective device may be set to trip when the detected current over time exceeds a time inverse overcurrent curve of the protective device. These protective devices may have a tolerance (e.g., +/−10% of the time inverse overcurrent curve) in which the protective device is expected to trip within. When protective devices trip due to fault conditions, it may be difficult to determine whether the protective device is operating at points that fall within the tolerance region of the time inverse overcurrent curve. For example, users may discover that the actual operating point of the protective device may fall outside of the tolerance region of the time inverse overcurrent curve when there is miscoordination with other protective devices, when downstream components are damaged, or when fault events occur upstream of the protective device. It may be time consuming and difficult to discover protective devices that may misoperate (e.g., trip when not expected to trip and/or not trip when expected to trip).

To detect when the protective devices are not operating as expected, wireless line sensors, such as faulted circuit indicators (FCIs), wireless current sensors (WCSs), and the like, may be co-located with protective devices on power lines. Wireless line sensors may detect fault magnitudes that indicate the current magnitudes during a fault of the power line. Further, wireless line sensors may obtain fault durations indicating the amount of time fault magnitudes are present on the power line.

As explained below, a central monitoring station may store the operating conditions of the protective device. For example, the central monitoring station may obtain a tolerance region of a time inverse overcurrent curve of a protective device. The central monitoring station may associate the protective device with a wireless line sensor that is co-located on the power line. The central monitoring station may obtain the fault magnitude and fault duration from the wireless line sensor(s) (e.g., via communication from a wireless line sensor collector). The central monitoring station may determine whether the fault magnitude and fault duration fall outside of the tolerance region of the protective device. The central monitoring station may notify an operator to check/service the protective device.

Figure 1:
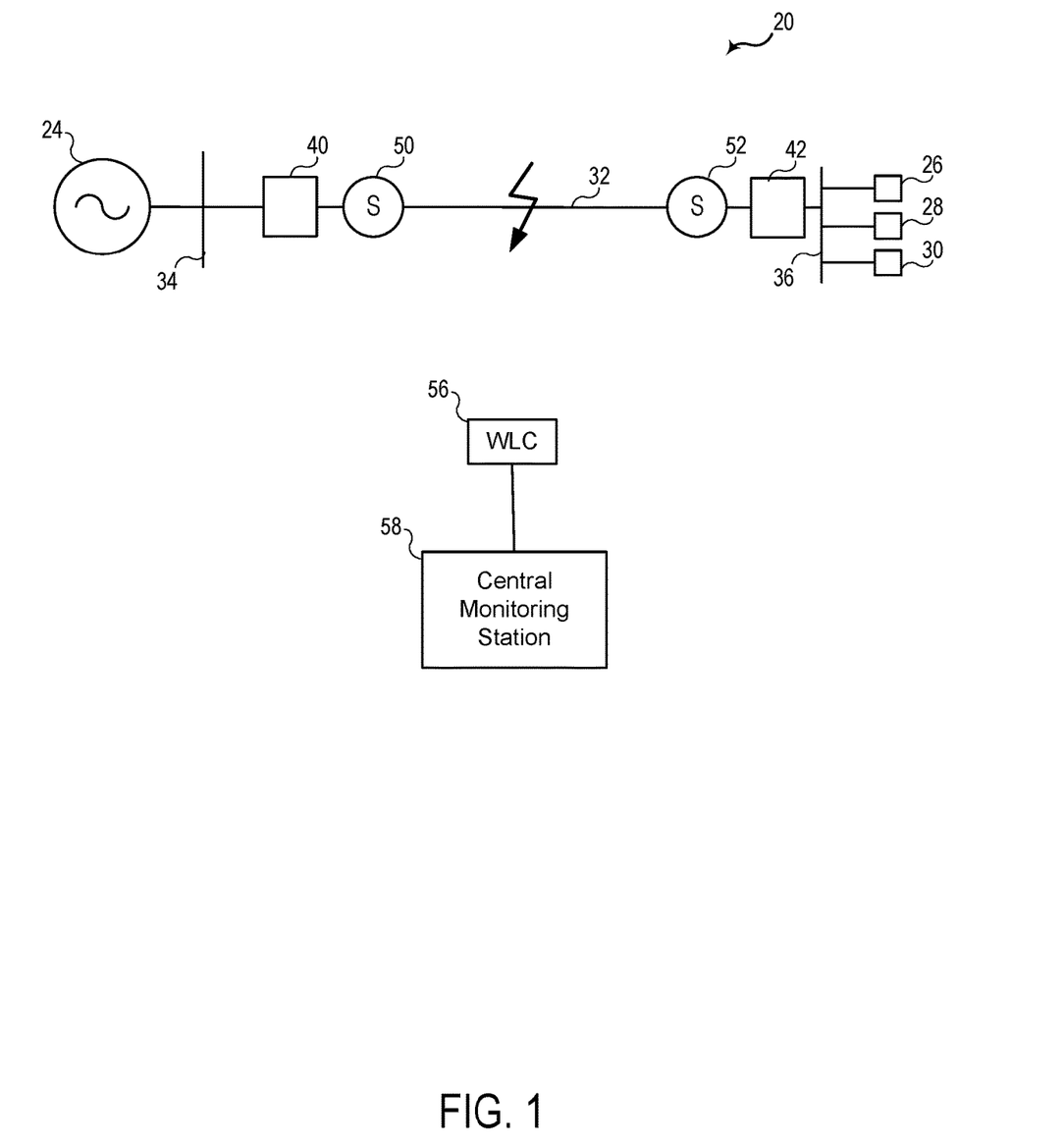
FIG. 1 is a one-line diagram of an electric power delivery system having a wireless line sensor that communicates fault magnitude and fault duration data to a central monitoring station to monitor operating conditions of a protective device, in accordance with an embodiment.

FIG. 1 is a one line diagram of an electric power delivery system 20 that includes a power source 24, such as a generator, that delivers power to loads 26, 28, and 30 via a power line 32, such as a transmission line, distribution line, or other conductor(s), connecting two nodes, which are illustrated as terminals 34 and 36. Terminals 34 and 36 may be buses in a transmission system supplied by the power source 24. Although illustrated in single-line form for purposes of simplicity, the power system 20 may be a multi-phase system, such as a three-phase electric power delivery system.

The electric power delivery system 20 is monitored and protected by a protective device 40, such as a hydraulic recloser, an electromechanical recloser, an electromechanical protective relay, or a fuse, among others. For example, electromechanical protective relays may open a circuit breaker when coils of the electromechanical relay detect fault conditions on the power line 32. Further, the protective device 40 may perform various protection functions that detect different fault conditions based on the electrical conditions of the power line 32. For instance, the protective device 40 may compare the magnitude of current to a threshold current and open the circuit breaker when the threshold current is exceeded. Another technique of protection mentioned above, referred to as time inverse overcurrent, compares the amount of current over a period of time to a trip curve. When the operating point of the current over a period of time exceeds the trip curve, within an allowable tolerance, the protective device 40 may open the circuit breaker.

In some embodiments, an additional protective device 42 may be installed upstream or downstream of the protective device 40 to limit the amount of the electric power delivery system disconnected due to a fault. Further, the additional protective device 42 may be coordinated with the protective device 40 such that one device is set to trip in a sequence. As an example, the additional protective device 42 may be coordinated to trip before the protective device 40 to allow the power source 24 to continue to provide power to other loads along power line 32 if a fault were to occur at load 26.

The protective device 40 may not open the circuit breaker at expected times and operating points of these devices may allow currents outside of tolerance regions of the curve. Over time, protective devices may degrade, may be impacted by the surrounding environment, or may not be installed properly. Further, it may be difficult to detect that the protective device is not tripping at expected times. For example, protective devices may be serviced and tested when there is a miscoordination with other protective devices, when devices inspect fault events from upstream IEDs, or when downstream components are affected.

Wireless line sensors 50 and 52, such as faulted circuit indicators (FCIs), wireless current sensors (WCSs), and the like, may be installed on the power line 32. Some wireless line sensors 50 and 52 may provide fault magnitude data that provides an indication when current exceeds a current threshold of the power line. As explained below, wireless line sensors 50 and 52 may provide fault magnitude and fault duration data to a wireless line sensor collector 56. The wireless line sensor collector 56 may communicate the fault magnitude and fault duration data to a central monitoring station 58. The central monitoring station 58 may determine whether the protective device 40 is operating within the tolerance region of the pre-defined time inverse overcurrent curve. The tolerance region is the region of time inverse overcurrent in which the protective device operates appropriately or coordinates appropriately with upstream devices to clear a fault. If the fault magnitude-duration operating point of the wireless line sensor 50 indicates that the protective device tripped outside of the tolerable region, such a trip may be an indicator that there is a potential issue with the protective device. The central monitoring station 58 may send a signal to notify an operator of the misoperation of the protective device 40 and to suggest an inspection of the mechanism of the protective device.

Figure 2:
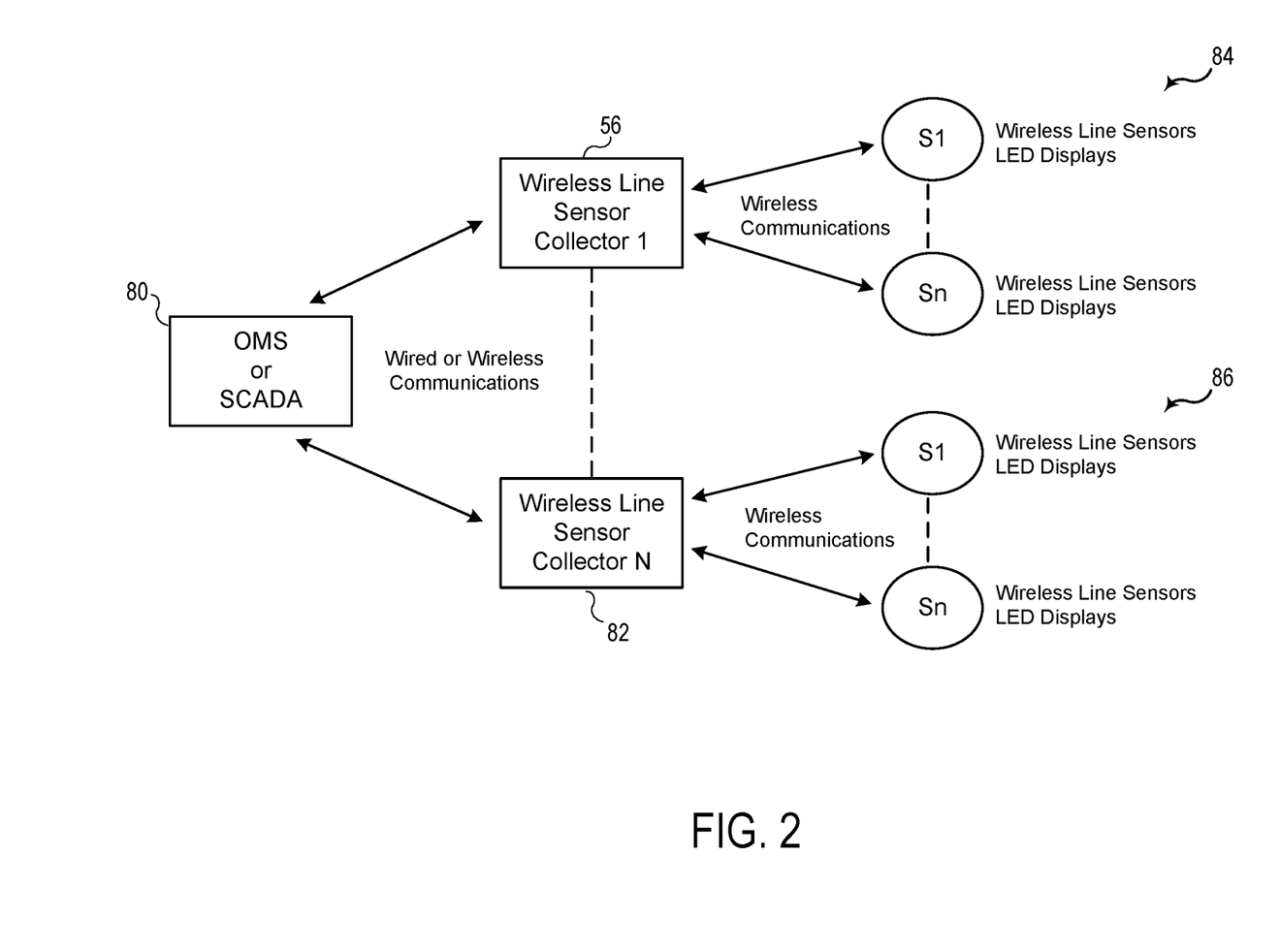
FIG. 2 is a network diagram of communication between the wireless line sensors and the central monitoring station of FIG. 1, in accordance with an embodiment

FIG. 2 is a communication diagram of the electric power delivery system 20, in accordance with an embodiment. The central monitoring station 58 may include an outage management system (OMS) or a supervisory control and data acquisition (SCADA) system 80 that allows the central monitoring station 58 to communicate with wireless line sensor collectors 56 and 82. In some embodiments, the central monitoring station 58 may be an independent device. In other embodiments, the central monitoring station 58 may be integrated or part of the SCADA system 80. The wireless sensor collectors 56 and 82 may communicate with the OMS or SCADA system 80 using wireless or wired communication. Each of the wireless line sensor collectors 56 and 82 may communicate wirelessly with a respective set of wireless line sensors 84 and 86. The set of wireless line sensors 84 may include wireless line sensors 50 and 52 at different locations on the power line 32, different phases (e.g., wireless line sensors 50A-C) of the power line 32, or off different branches of the power line 30.

Figure 3:
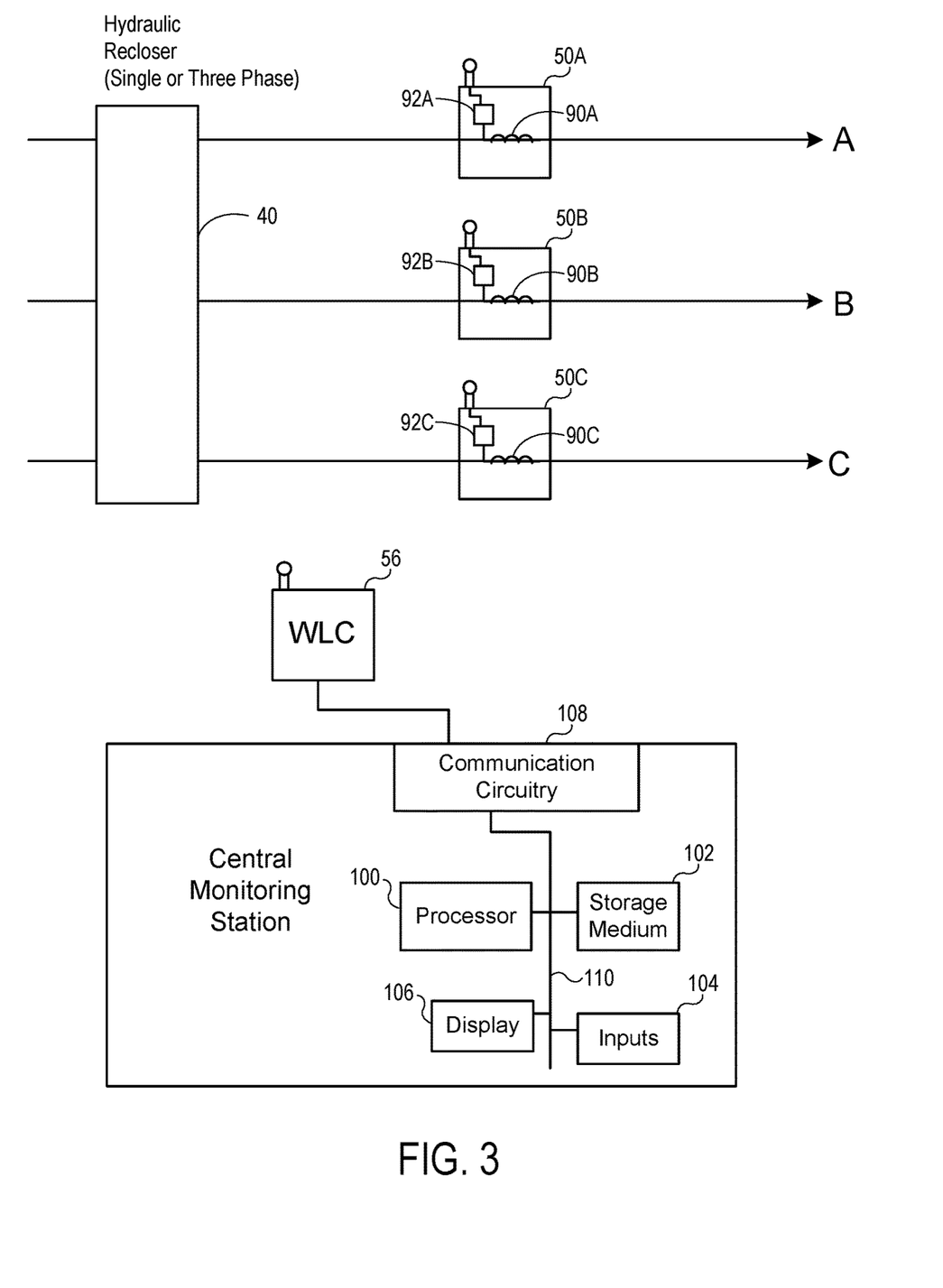
FIG. 3 is a block diagram of the electric power delivery system of FIG. 1 that includes three phases in which each phase has a wireless line sensor, in accordance with an embodiment.

FIG. 3 is a block diagram of a three-phase power system with the power line 32 being protected by the protective device 40. In the illustrated embodiment, the protective device 40 is embodied as a three-phase hydraulic recloser. Each phase may include a wireless line sensor 50A-C that monitors the current of the phase. The wireless sensor 50A-C may each include one or more current transformer coils 90A-C. For example, first current transformer windings may be used to detect current proportional to the current on the power line to allow the wireless current sensor to obtain current measurements. The current measurements from the current transformer coils 90A-C may be used to determine the fault magnitude measurements. A second current transformer windings may be used to obtain power from the power line to power the wireless line sensor 50A-C. In some embodiments, the wireless line sensor 50A-C may obtain power from the power line via the second current transformer windings without having any power or communication conductors connected to the wireless line sensor collector 56.

The wireless line sensors 50A-C may include processing and communication circuitry 92A-C to send current measurements to the wireless line collector 56. The wireless line sensors 50A-C may further include a timer. For example, the timer may count, from the number of clock cycles of the processing and communication circuitry 92A-C, to obtain the fault duration measurements.

The wireless line sensor collector 56 may be embodied as, for example, a fault and load receiver. The wireless line sensor collector 56 may receive current measurements from each of the wireless sensors 50A-C. The wireless line sensor collector 56 may then send, via wired or wireless communication, the current measurements to the central monitoring station 58.

The central monitoring station 58 may include a processor 100, a computer-readable storage medium 102, input structures 104, a display 106 and communication circuitry 108. The central monitoring station 58 may include one or more bus(es) 110 connecting the processor 100 or processing unit(s) to the computer-readable storage medium 102, the input structures 104, the display 106, and/or the communication circuitry 108. The computer-readable storage medium 102 may be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the communication circuitry 108. The processor 100 may operate using any number of processing rates and architectures.

The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices.

The communication circuitry 108 may include communication ports, such as ethernet and serial ports. Further, the communication circuitry 108 may include a wireless transceiver to communicate with one or more electronic devices, such as the wireless line sensor collectors 56 and 82. The central monitoring station 58 may include a display screen 106 that displays information to notify an operator of operating parameters of the electric power delivery system 20, such as current measurements, voltage measurements, recloser status, etc. The input structures 104 may include buttons, controls, universal serial bus (USB) ports, or the like, to allow a user to provide input settings to the central monitoring station 58. In some embodiments, the display 106 may be a touchscreen display.

Figure 4:
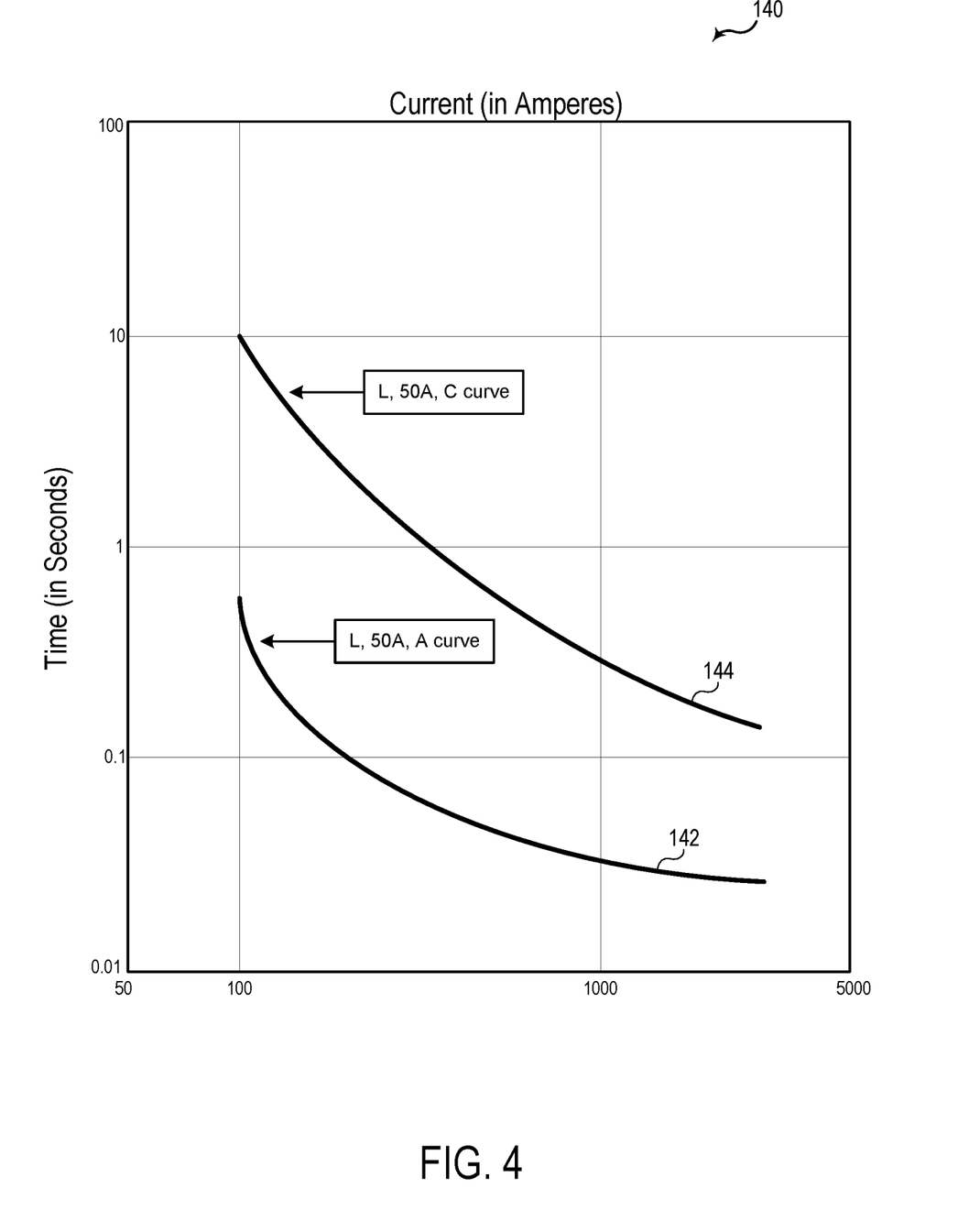
FIG. 4 is a graph of time with respect to current of tripping curves of protective devices of the electric power delivery system of FIG. 1, in accordance with an embodiment.

FIG. 4 is a graph 140 of a time inverse overcurrent curve of a hydraulic recloser that may be used as the protection device 40, in accordance with an embodiment. In the illustrated embodiment, the graph 140 shows the x-axis as current in amperes and the y-axis as time in seconds. The first parameter indicates the type of hydraulic recloser (L type). The second parameter is the number (50A) that indicates the solenoid coil rating (or minimum trip value) of the hydraulic recloser. The third parameter is the type of curve. An A curve is a relatively faster curve, and B, C, and D curves are time-delayed curves with a delay that can be incorporated when assembling the recloser. The A type curve 142 may be the maximum clearing time for one operation, and B, C, and D curves (e.g., the C type curve 144) may be the average clearing time for one operation with variation of +/−10% at 25C.

Figure 5:
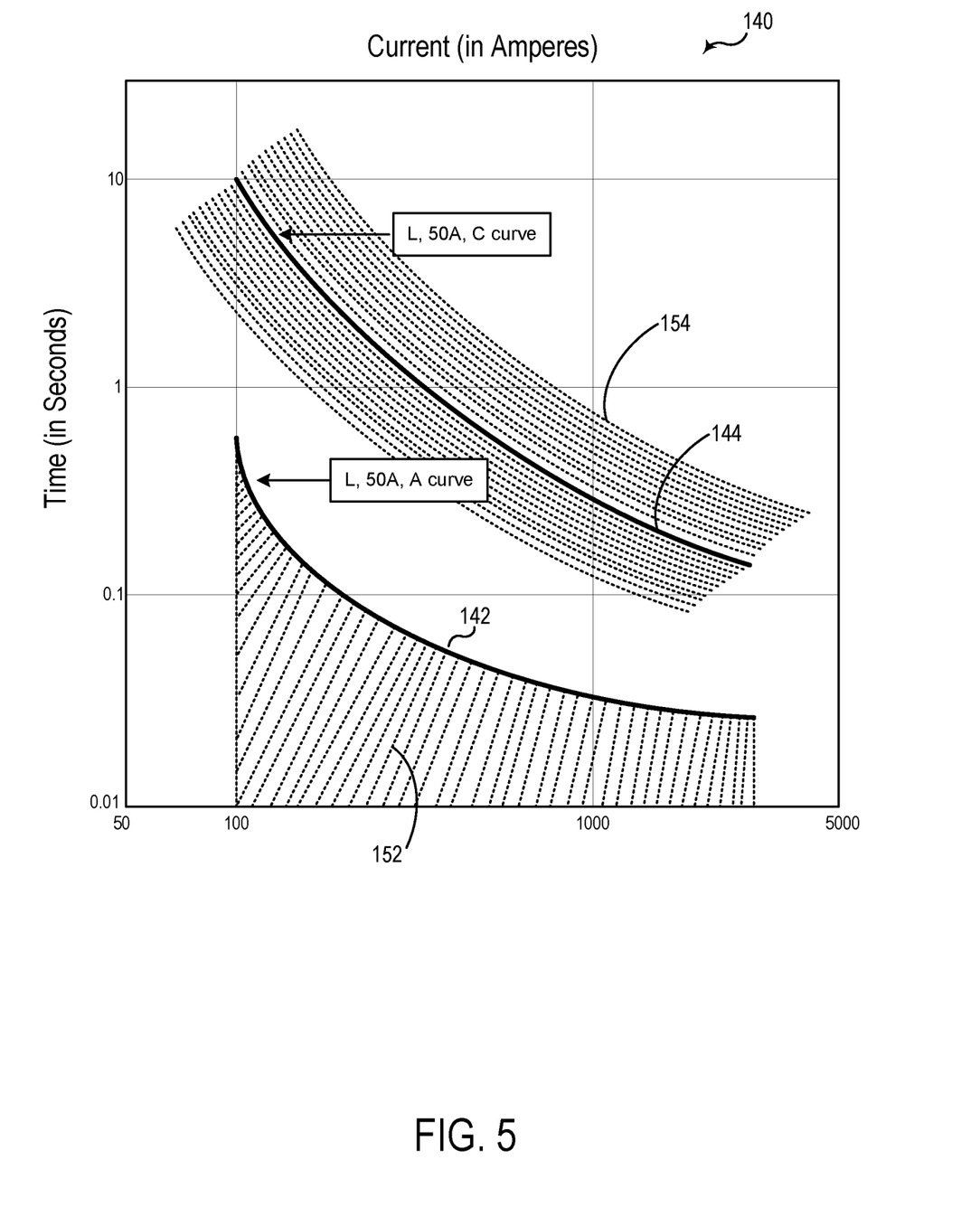
FIG. 5 is another graph of the tripping curves of protective devices of FIG. 4 with tolerance regions overlayed thereupon, in accordance with an embodiment.

FIG. 5 is the graph 140 of time inverse overcurrent tolerance regions for the A curve and the C curve of FIG. 4, in accordance with an embodiment. As shown in FIG. 5, the tolerance region 152 for an A type curve 142 of a hydraulic recloser may refer to the area under the A curve. The tolerance region 154 for a C type curve 144 of a hydraulic recloser may refer to the area within a predetermined amount (e.g., +/−10%, +/−20%, etc.) of the operating curve. If the protective device 40 trips outside of the tolerance regions 152 and 154, it is an indication that the protective device 40 may have misoperated or will misoperate and it is desirable to inspect the protective device 40. To determine if the protective device 40 operated within the tolerance region 152 of the A curve 142, the wireless line sensor 50 may compute both the fault magnitude and the fault duration. The wireless line collector 56 may receive the fault magnitude and fault duration from the wireless line sensor 50. The central monitoring station 58 may then determine whether the fault magnitude-fault duration tripping point falls within the tolerance region 152. If the fault magnitude-fault duration point falls outside of the tolerance region 152, then the central monitoring station may notify an operator to inspect the protective device 40.

Similarly, to determine whether the protective device 40 operated within the tolerance region of the B, C, or D curve, the wireless line sensor 50 may compute both the fault magnitude and the fault duration. The central monitoring station may compare the fault duration and the fault magnitude with the tolerance region 154 to see if the fault duration and fault magnitude are within the predetermined amount (e.g., +/−10%) of the operating curve.

In some embodiments, protective devices 40 and 42 may be coordinated with each other to trip at different times. For example, the recloser 42 may be set to trip before the recloser 40 to allow faults caused on the loads 26, 28, and 30 to be tripped first to allow the power line 32 to continue providing power to other loads on the line. Further, if the recloser 42 does not trip after a delay from when the recloser 42 is set to trip, the recloser 40 may trip to protect the power source 24 by disconnecting any faults on the power line 32 from affecting the power source 24.

A first technique to achieve coordination between two protective devices is to use different solenoid coil sizes and the same type of TCC curve. For example, an upstream recloser may use a larger solenoid size than the downstream recloser. A second technique is to use the same solenoid size and different types of TCC curves. This may allow a downstream recloser to operate faster than the upstream recloser. A third technique is to use different sequences. For example, the upstream recloser may use a faster curve and three time-delayed curves and the downstream recloser may use two faster curves and two time-delayed curves.

Figure 6:
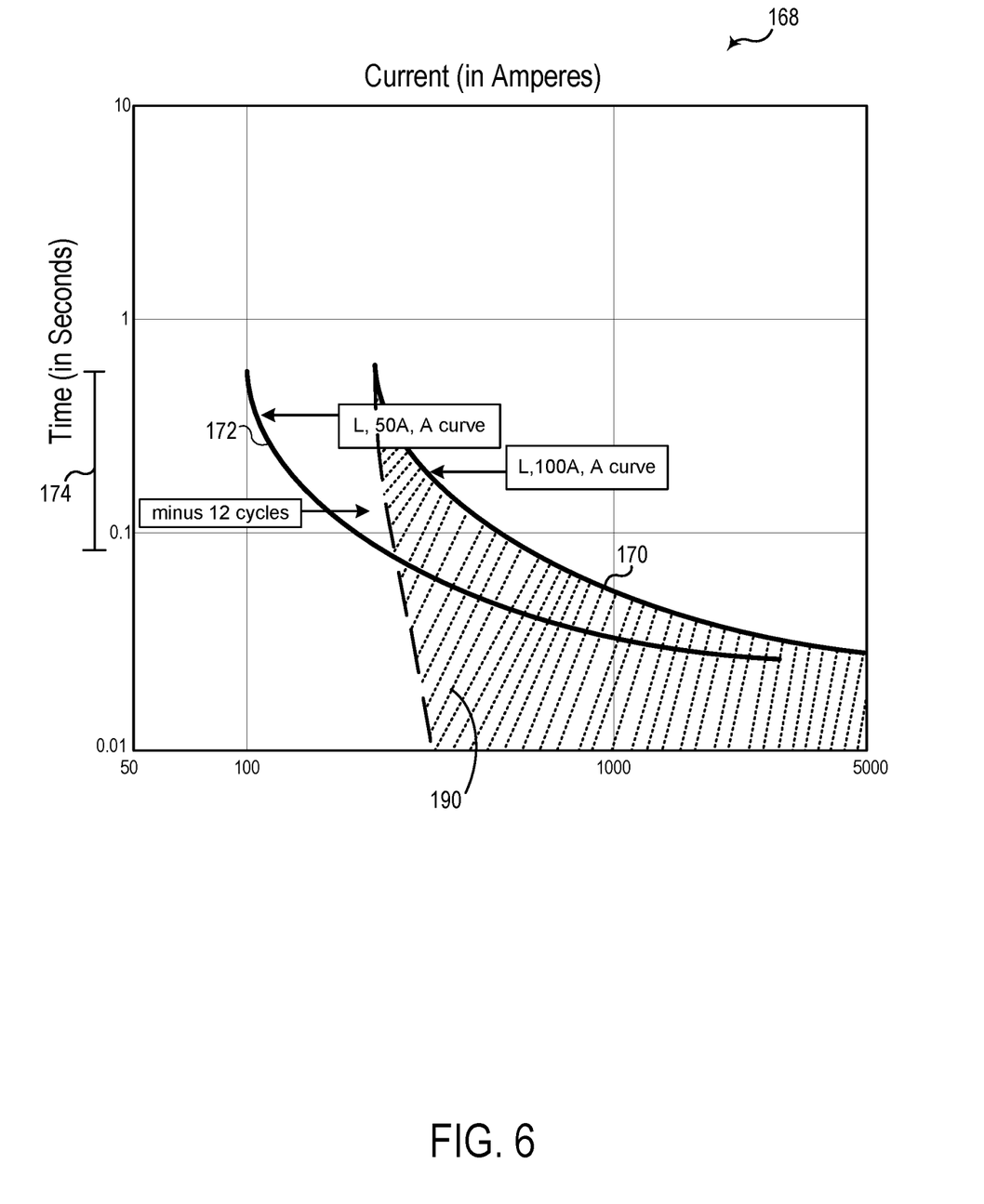
FIG. 6 is another graph of tripping curves of protective devices in the electric power delivery system of FIG. 1 that use a time delay to coordinate between protective devices, in accordance with an embodiment.

FIG. 6 is a graph 168 of another embodiment in which the recloser 40 is set to use a time delay to achieve coordination with a downstream recloser 42. In the illustrated example, the upstream recloser 40 (i.e., recloser closer to the power source 24) has a time delayed curve 170 at which the recloser 40 trips. Further, the downstream recloser 42 may be set to operate with the A curve 172. The time separation 174 between the curves 170 and 172 of the reclosers 40 and 42 is used to achieve coordination.

The central monitoring station 58 may use the fault duration and fault magnitude to determine whether the protective devices 40 and 42 achieved coordination in which the expected order of tripping of protective devices actually occurs. For example, when the time separation 174 is between 2 and 12 cycles, the central monitoring station 58 may use the fault magnitude and fault duration to determine whether the protective devices 40 and 42 have achieved coordination or mis-coordination.

Figure 7:
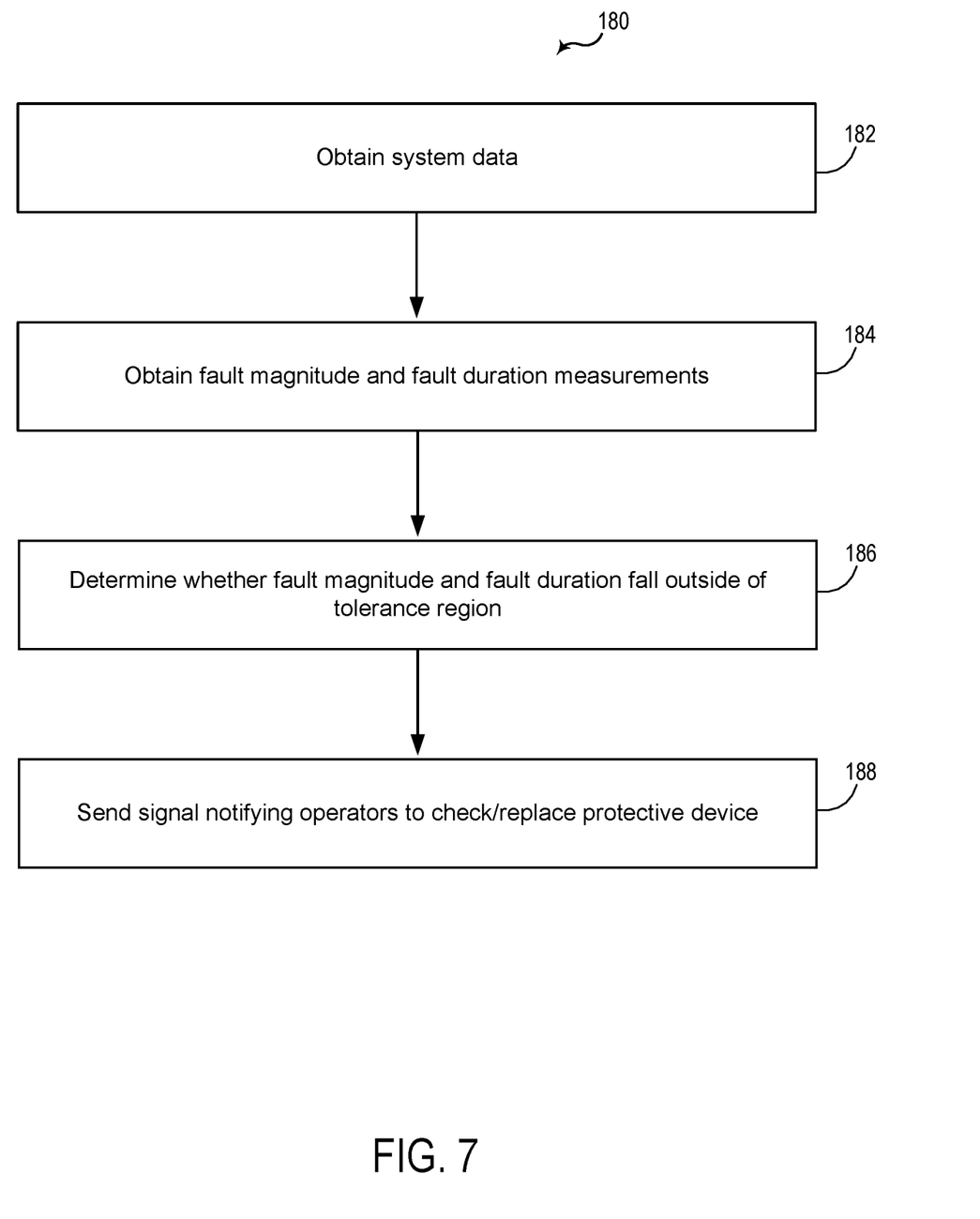
FIG. 7 is a flow chart of a process performed by the central monitoring station of FIG. 1, in accordance with an embodiment.

FIG. 7 is a flow chart of a process 180 that may be performed by the central monitoring station 58 to predict maintenance of protective devices using wireless line sensors. The central monitoring station 58 may begin by obtaining power system data and settings (block 182). For example, the central monitoring station 58 may receive the topology of the electric power delivery system 20, circuit breaker statuses, protective device information (e.g., operating curves 142, 144, 170, and 172, protection device type, solenoid type, time delays, etc.), and sensor locations, among others. The central monitoring station 58 may associate the protective device 40 with the wireless line sensor 50 that is co-located (e.g., located within a predetermined distance (5 feet, 10 feet, 50 feet, etc.) of each other) based on the received topology or inputs from a user associating the devices. In some embodiments, the central monitoring station 58 may receive inputs from an operator indicating the protective device parameters into the central monitoring station 58, and the central monitoring station may obtain the tolerance regions and/or tripping curves from a look up table that relates protective device parameters with tolerance regions and/or tripping curves.

Once one or both of the protective devices 40 and 42 operates, the co-located wireless line sensors 50A-C may compute the fault magnitude and the fault duration and send the fault magnitude and fault duration to the wireless line sensor collector 56. For example, the wireless line sensors 50A-C may detect, based on current from the current transformers 90A-C, the current on the power line exceeding a current threshold. The wireless line sensor 50A-C may begin the timer and count the number of clock cycles that occur from the time that the current exceeded the current threshold. The wireless line sensor 50A-C may stop the timer when the current falls below the current threshold (e.g., upon tripping of the protective device 40).

The wireless line sensor collector 56 then sends the fault magnitude and fault duration to the central monitoring station 58. The central monitoring station 58 may obtain the fault magnitude and fault duration of the power line 32. For example, the fault magnitude may include a maximum fault value, a root-means square (RMS) value indicating the current over a period of time, or a combination thereof. Further, the fault duration may include the time over which the RMS value or maximum fault value is calculated. In some embodiments, the fault magnitude and fault duration may be sent to the central monitoring station 58 as current measurements and time intervals of the current measurements over a period of time surrounding (e.g., seconds before and after tripping) of the protective device 40.

As mentioned above, the central monitoring station 58 may store the operating curves (i.e., tripping curve) and/or tolerance regions of the reclosers/electromagnetic relays. The central monitoring station 58 receives the fault magnitude and fault duration and determines whether the protective device 40 operated outside of the tolerance region of the curves (block 186). In some embodiments, the central monitoring station 58 may store a lookup table of various points along the boundary of the tolerance region to determine whether the received fault magnitude-fault duration tripping point is between the set of points along the boundary. If the protective device 40 operated outside the tolerance region, the central monitoring station 58 may provide a signal indicating that there is a potential issue with the protective device 40 to notify an operator to inspect the protective device 40 (block 188). If the fault magnitude and fault duration point of the downstream recloser (i.e., expected to operate along curve 172) operates in the delayed region 190, then there may have been a miscoordination and the central monitoring station 58 may notify the operator to inspect the downstream recloser. For example, the central monitoring station 58 may provide an alert on the display of the central monitoring station 58 or notify the operator using another form of communication (e.g., text message, email, etc.).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A non-transitory, tangible, computer-readable medium, having instructions stored thereon, wherein the instructions, when executed by a computer processor, cause the computer processor to:
   obtain a tolerance region of a time inverse overcurrent curve of a protective device on a power line of an electric power delivery system;
   obtain a fault magnitude measurement and a fault duration measurement of a wireless line sensor on the power line;
   determine that the protective device is operating outside of the tolerance region based at least in part on the fault magnitude measurement and the fault duration measurement; and
   provide a signal indicating that there is a potential issue with the protective device.

2. The non-transitory, computer-readable medium of claim 1, wherein the instructions are configured to cause the processor to receive the fault magnitude measurement and the fault duration measurement from a wireless line sensor collector.

3. The non-transitory, computer-readable medium of claim 1, wherein the tolerance region comprises plus or minus a predetermined amount of the time inverse overcurrent curve.

4. The non-transitory, computer-readable medium of claim 1, wherein the instructions are configured to cause the processor to store operating parameters of the protective device at a central monitoring station of the electric power delivery system.

5. The non-transitory, computer-readable medium of claim 4, wherein the operating parameters comprise a device type, a solenoid coil rating, a curve type, or any combination thereof.

6. The non-transitory, computer-readable medium of claim 1, wherein the instructions are configured to cause the processor to store a time delay of the protective device with respect to another protective device.

7. The non-transitory, computer-readable medium of claim 1, wherein the fault magnitude measurement comprises a current measurement that exceeds a threshold current.

8. A method, comprising:
   obtaining a time inverse overcurrent tolerance region of a protective device on a power line;
   obtaining a fault magnitude measurement and a fault duration measurement of a wireless line sensor on the power line;
   determining that the protective device is operating outside of the tolerance region based at least in part on the fault magnitude measurement and the fault duration measurement; and
   providing a signal indicating that there is a potential issue with the protective device.

9. The method of claim 8, comprising associating the protective device with the wireless line sensor based on the wireless line sensor being co-located with the protective device.

10. The method of claim 8, wherein the tolerance region comprises a preset tolerance percentage plus or minus of the time inverse overcurrent curve.

11. The method of claim 8, comprising receiving a user input to associate the fault magnitude and the fault duration from the wireless line sensor with the operating conditions of the protective device.

12. The method of claim 8, comprising determining whether the protective device achieved coordination with another protective device based on the fault magnitude measurement and the fault duration measurement.

13. The method of claim 8, comprising obtaining the time inverse overcurrent tolerance region based on stored operating parameters of the protective device.

14. The method of claim 13, wherein the operating parameters comprise a device type, a solenoid coil rating, a curve type, or any combination thereof.

15. The method of claim 8, comprising displaying a notification to an operator on a display of a central monitoring station as the signal.

16. A central monitoring station, comprising:
a memory;
a processor operatively coupled to the memory, wherein the processor is configured to:
    obtain a tolerance region of a time inverse overcurrent curve of a protective device on a power line of an electric power delivery system;
    obtain a fault magnitude measurement and a fault duration measurement of a wireless line sensor on the power line;
    determine that the protective device is operating outside of the tolerance region based at least in part on the fault magnitude measurement and the fault duration measurement; and
    provide a signal indicating that there is a potential issue with the protective device.

17. The central monitoring station of claim 16, wherein the processor is configured to obtain a topology of the electric power delivery system.

18. The central monitoring station of claim 16, wherein the processor is configured to determine that the protective device and the wireless line sensor are co-located based on being installed on the same power line and being within a preset distance from each other.

\* \* \* \* \*